United States Patent
Sharma et al.

(10) Patent No.: US 9,461,628 B2
(45) Date of Patent: Oct. 4, 2016

(54) SINGLE ENDED CHARGE TO VOLTAGE FRONT-END CIRCUIT

(71) Applicant: Texas Instruments Incorporated, Dallas, TX (US)

(72) Inventors: Rahul Sharma, Bangalore (IN); Nagesh Surendranath, Bangalore (IN); Sandeep Kesrimal Oswal, Bangalore (IN)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 84 days.

(21) Appl. No.: 14/580,388

(22) Filed: Dec. 23, 2014

(65) Prior Publication Data

US 2016/0182017 A1 Jun. 23, 2016

(51) Int. Cl.
| | |
|---|---|
| H03F 3/45 | (2006.01) |
| H03K 3/012 | (2006.01) |
| H02M 1/08 | (2006.01) |
| H02M 1/12 | (2006.01) |
| H03K 17/687 | (2006.01) |
| H03H 11/12 | (2006.01) |
| H03H 19/00 | (2006.01) |
| G06G 7/184 | (2006.01) |
| G05F 1/56 | (2006.01) |
| G06G 7/186 | (2006.01) |

(52) U.S. Cl.
CPC ............... *H03K 3/012* (2013.01); *H02M 1/08* (2013.01); *H02M 1/12* (2013.01); *H03K 17/687* (2013.01); *G05F 1/561* (2013.01); *G06G 7/184* (2013.01); *G06G 7/186* (2013.01); *H02M 2001/123* (2013.01); *H03H 11/1291* (2013.01); *H03H 19/004* (2013.01)

(58) Field of Classification Search
None
See application file for complete search history.

(56) References Cited

U.S. PATENT DOCUMENTS

| | | | | |
|---|---|---|---|---|
| RE28,579 E | * | 10/1975 | Uchida | G06G 7/186 327/345 |
| 4,550,295 A | * | 10/1985 | Sasaki | G06G 7/1865 327/337 |
| 5,367,154 A | | 11/1994 | Pfeiffer | |
| 5,841,383 A | * | 11/1998 | Regier | G11C 27/028 327/94 |
| 6,606,123 B2 | | 8/2003 | Mizuno | |
| 7,034,611 B2 | | 4/2006 | Oswal et al. | |
| 7,136,005 B1 | | 11/2006 | Lyden et al. | |
| 7,507,947 B2 | | 3/2009 | Bamji et al. | |

(Continued)

OTHER PUBLICATIONS

Burr-Brown, "Precision Switched Integrator Transimpedance Amplifier", IVC102, Jun. 1996 Burr-Brown Corporation, PDS-1329A, 12 pages.

(Continued)

*Primary Examiner* — Tuan T Lam
(74) *Attorney, Agent, or Firm* — Gregory J. Albin; Frank D. Cimino

(57) ABSTRACT

Charge to voltage conversion integrator circuitry for data acquisition front-end and other applications to provide a single-ended up a voltage using an input bias capacitance and a switching circuit to selectively place an input transistor in a negative feedback configuration in a first mode to charge the input bias capacitance to a calibration voltage for compensating integrator amplifier bias circuitry, with the switching circuit connecting an input node and the input bias capacitance in a second mode to integrate the input current signal across a feedback capacitance to provide a single-ended output voltage with the input bias capacitance maintaining a zero voltage at the input node.

20 Claims, 5 Drawing Sheets

(56) References Cited

U.S. PATENT DOCUMENTS

| | | |
|---|---|---|
| 7,667,501 B2 | 2/2010 | Surendranath et al. |
| 7,884,746 B2 | 2/2011 | Oswal et al. |
| 7,911,256 B2 | 3/2011 | Venkataraman et al. |
| 2005/0179468 A1 | 8/2005 | Zhou et al. |
| 2009/0273386 A1* | 11/2009 | Korobeynikov ....... G06G 7/186 327/337 |
| 2010/0214015 A1* | 8/2010 | Takasawa ............... G06G 7/186 327/563 |
| 2013/0113461 A1 | 5/2013 | Mantri et al. |
| 2013/0207821 A1* | 8/2013 | Sherry .................. H03M 3/322 341/143 |
| 2014/0132324 A1* | 5/2014 | Wen ........................ G05F 1/462 327/306 |
| 2015/0338866 A1* | 11/2015 | Hu ......................... H02M 3/157 323/280 |

OTHER PUBLICATIONS

Texas Instruments, "32-Channel, Current-Input Analog-to-Digital Converter", DDC 232, SBAS331D, Aug. 2004, Revised Apr. 2010, 34 pgs.

* cited by examiner

US 9,461,628 B2

SINGLE ENDED CHARGE TO VOLTAGE FRONT-END CIRCUIT

BACKGROUND

Current to voltage converter circuits are used in a variety of applications, such as data acquisition systems (DAS) or other signal conditioners or interface circuits, typically using a differential amplifier as a front-end integrator. In many applications, a sensor such as a photo diode provides a single ended current input signal to be integrated for a given time and then converted by an analog to digital converter. Furthermore, the circuitry must maintain a zero input voltage for proper operation of the sensor element. In the past, differential amplifier circuits were used. However, differential circuit amplifiers suffer from increased power consumption relative to single ended amplifiers, and the provision of the additional differential to single-ended amplifier consumes further power. Moreover, the noise contribution of the additional circuitry can degrade system performance. Accordingly, a need remains for improved charge to voltage integrator circuitry with reduced noise error and power consumption for various applications including data acquisition system front-end integrators.

SUMMARY

Presently disclosed embodiments provide integrator circuits including a single ended amplifier with an input transistor comprising a control terminal as well as a second terminal for providing a current to a first internal node, along with a feedback capacitance selectively coupled between an input node and an output node, and an input bias capacitance selectively coupled between the input transistor control terminal and one of a constant voltage node and the input node. A switching circuit selectively places the input transistor in a negative feedback configuration in a first mode to charge the input bias capacitance to a calibration voltage for compensating integrator amplifier bias circuitry. In certain implementations, the integrator includes a first bias circuit with a first transistor coupled between the first internal node and a first supply node, as well as a second bias circuit including a second transistor coupled between a second supply node and a second internal node, where the calibration voltage represents a control voltage which causes the input transistor to conduct a current equal to a difference between a first bias current flowing in the first bias circuit and a second bias current flowing in the second bias circuit. In a second mode, the switching circuit couples the input node with the input bias capacitance to integrate the input current signal across a feedback capacitance for providing a single-ended output voltage while the input bias capacitance maintains a substantially zero voltage at the input node. In certain embodiments, the integrator circuit includes an amplifier circuit having third and fourth transistors respectively coupled between the output node and the first and second internal nodes, with a transconductance amplifier and an offset capacitance to set a bias for the amplifier transistors in an auto-zero phase of the first mode, for subtracting the circuit noise biases during integration of the current input signal across the feedback capacitance in the second mode.

DESCRIPTION OF THE VIEWS OF THE DRAWINGS

The following description and drawings set forth certain illustrative implementations of the disclosure in detail, which are indicative of several ways in which the various principles of the disclosure may be carried out. The illustrated examples, however, are not exhaustive of the many possible embodiments of the disclosure. Other objects, advantages and novel features of the disclosure will be set forth in the following detailed description when considered in conjunction with the drawings, in which.

DETAILED DESCRIPTION

Figure 1:
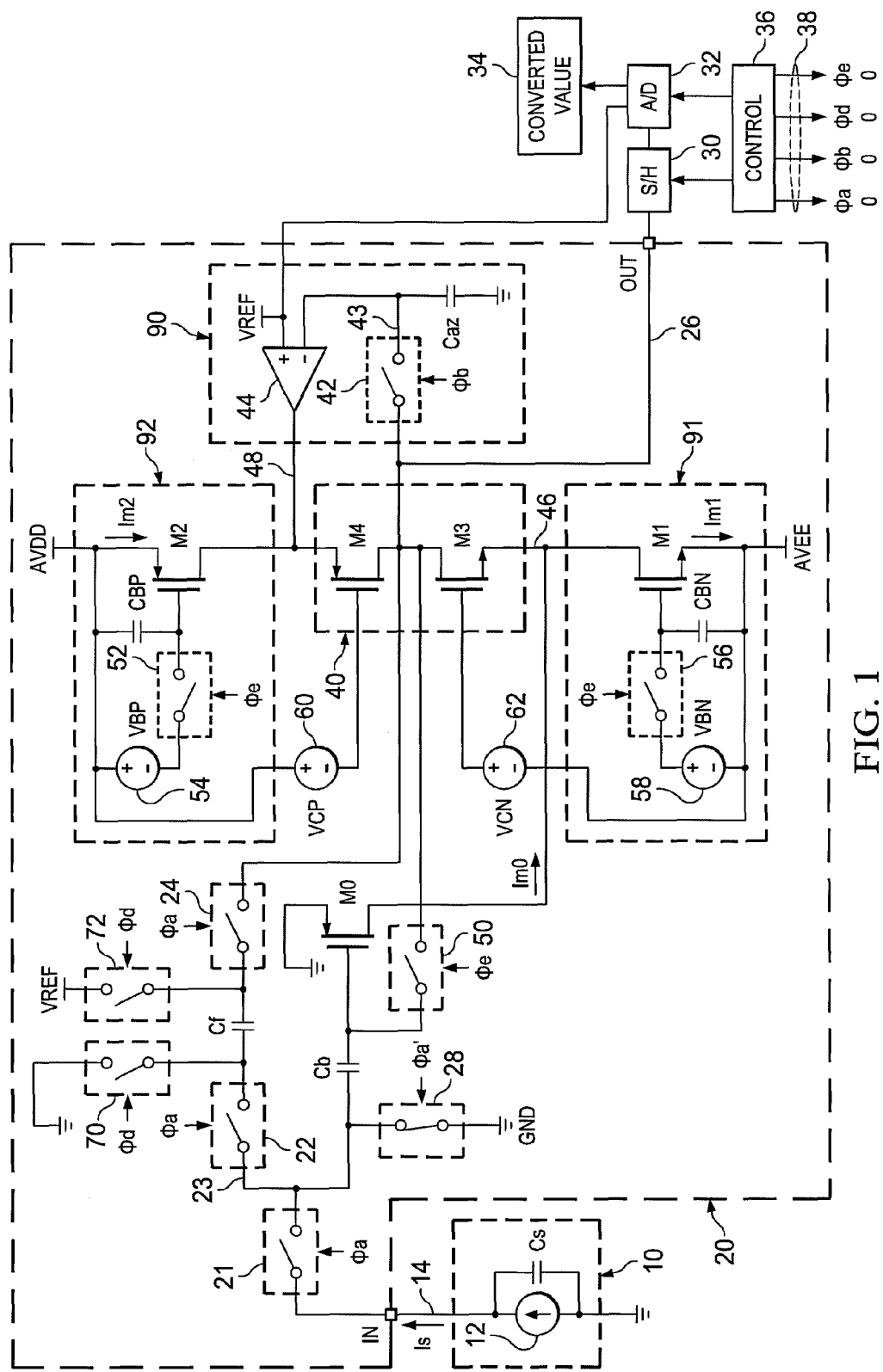
FIG. 1 is a schematic diagram illustrating a current to voltage integrator circuit with an input transistor and a feedback capacitance providing a single-ended voltage output representing a received current input signal, including an input bias capacitance and switching circuit for maintaining a sensor input node at substantially zero volts during integration in accordance with one or more aspects of the present disclosure.
Figure 3:
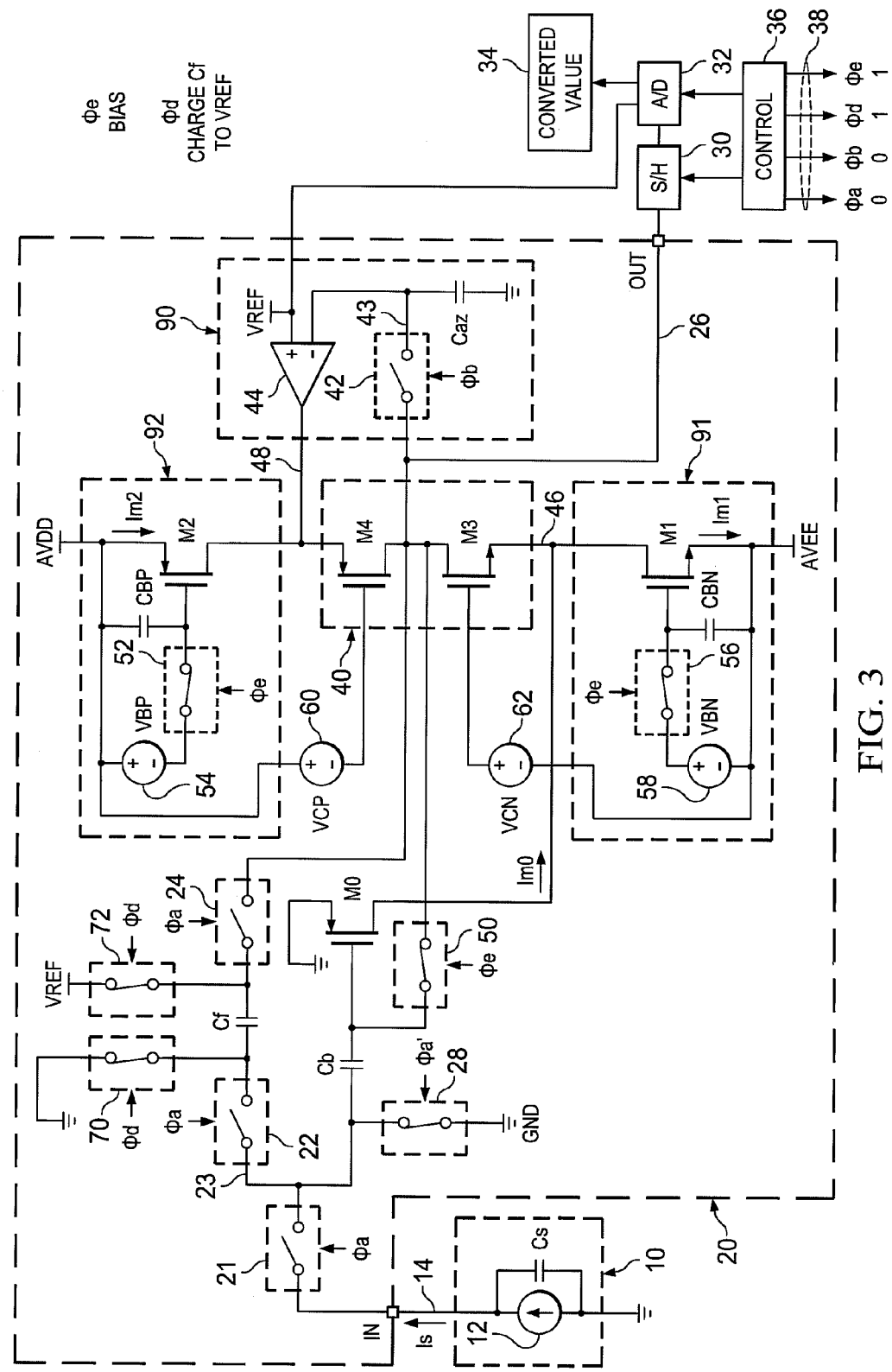
FIG. 3 is a schematic diagram illustrating switching operation in the current to voltage integrator circuit of FIG. 1 during a first phase of a first mode to charge an input bias capacitance while the input transistor is connected in a negative feedback configuration.
Figure 4:
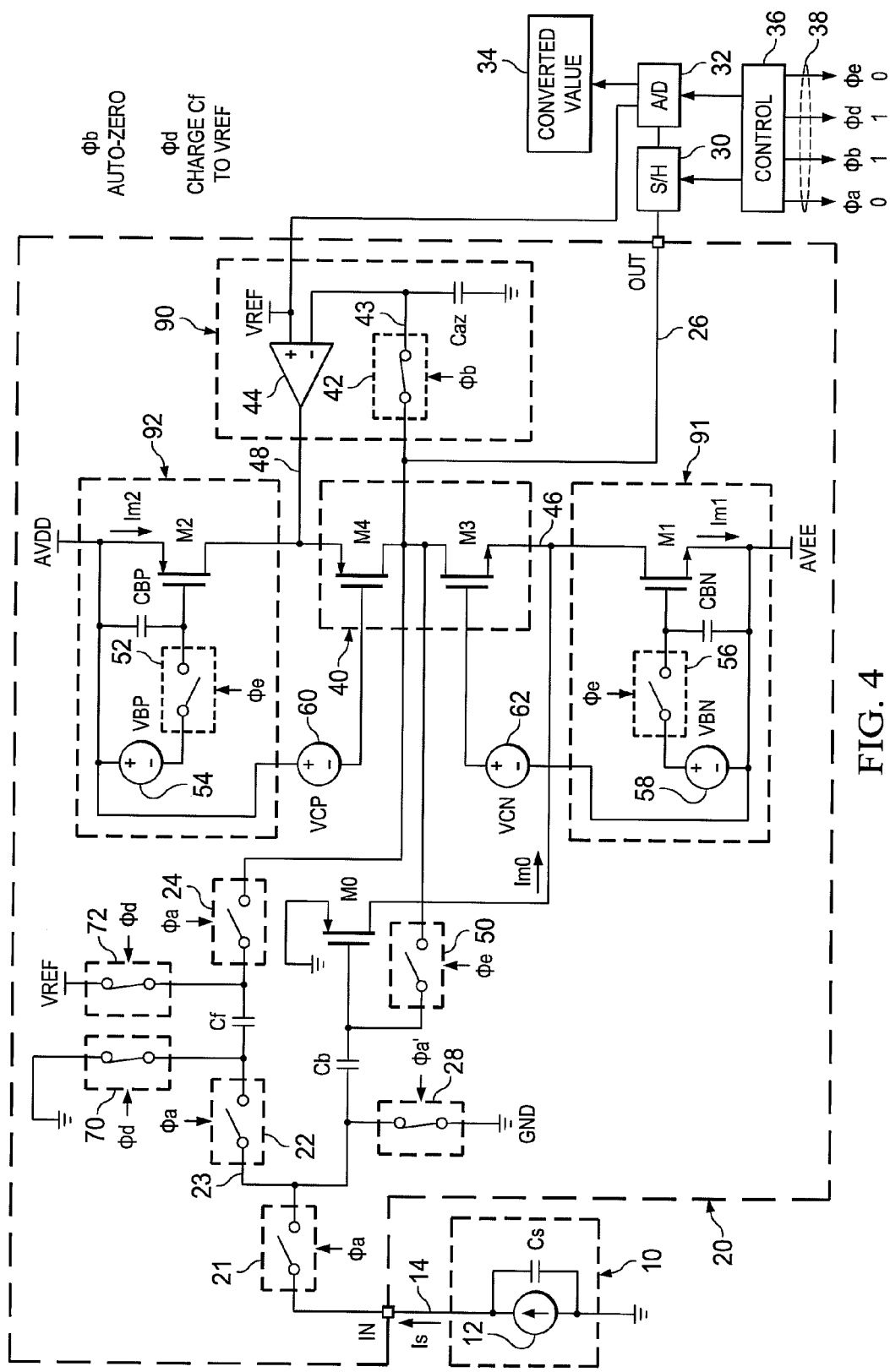
FIG. 4 is a schematic diagram illustrating the integrator circuit of FIGS. 1 and 3 during auto-zero operation in a second phase of the first mode.
Figure 5:
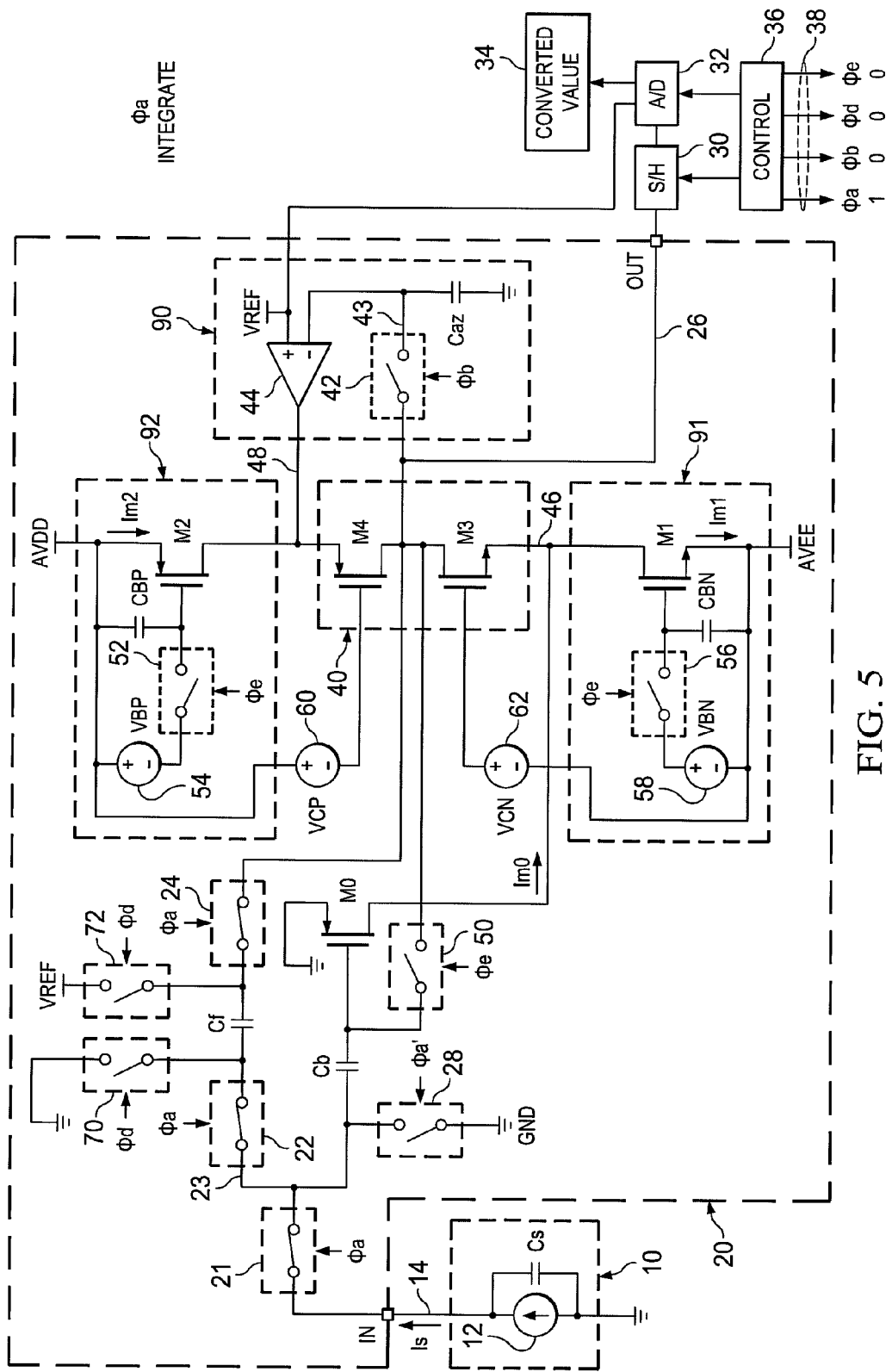
FIG. 5 is a schematic diagram illustrating the integrator circuit of FIGS. 1, 3 and 4 in a second mode of operation for integrating a current input signal to set a single-ended output voltage.

One or more embodiments or implementations are hereinafter described in conjunction with the drawings, wherein like reference numerals are used to refer to like elements. FIGS. 1 and 3-5 illustrate a current to voltage integrator circuit 20 according to a first embodiment, including an input terminal or node 14 (IN) for receiving a current signal Is from a sensor 10, where FIGS. 3-5 show operation of the integrator circuit 20 in different switching configurations for implementing multi-mode operation for calibrating the circuit with respect to offsets in noise, as well as for implementing an integration mode of operation for integrating the input current signal Is. The circuitry 20 can be used for signal conditioning or otherwise interfacing a suitable input current signal Is, where the illustrated embodiment may be used for interfacing a photo diode type sensor 10 with a current source 12 and having a sensor capacitance Cs schematically illustrated as shown in FIG. 1. In operation, the circuit 20 integrates the sensor current Is across a feedback capacitance Cf to provide a single ended output voltage signal at an output node or terminal 26 (OUT) for use by subsequent circuitry, such as a sample and hold (S/H) circuit 30 providing an input to an analog to digital (A/D) circuit 32 to generate a converted value 34 representing the input current signal Is. In this example, the sample and hold circuit 30 and the analog to digital converter 32 operate according to timing control signals from a control circuit 36. In this embodiment, moreover, the control circuit 36 further provides control signals 38 (Φa, Φb, Φd and Φe) to switching circuitry within the integrator circuit 20 as described further below.

As seen in FIG. 1, the integrator circuit 20 includes an input transistor M0, for example, a PMOS transistor with a gate control terminal coupled with an input bias capacitance Cb, a source terminal connected to a constant voltage node, for example a circuit ground GND, and a drain terminal coupled with (e.g., connected to) a first internal node 46 for providing a current Im0 according to the voltage at the gate terminal. In addition, the circuit 20 includes an amplifier or gain circuit 40 coupled between the first internal node 46 and a second internal node 48, including a PMOS transistor M4 coupled between the second internal node 48 and the output node 26 and an NMOS transistor M3 coupled between the output node 26 and the first internal node 46. A voltage source 60 (VCP) provides a voltage to the gate of M4, and a voltage source 62 (VCN) provides a voltage to the gate of M3 as shown in FIG. 1. In one non-limiting example, VCP=1.0 V and VCN=1.0 V.

A first bias circuit 91 is coupled between the first internal node 46 and a first supply node AVEE, and a second bias circuit 92 is coupled between the second internal node 48 and a second supply node AVDD, where AVDD is at a supply voltage higher than the voltage of AVEE. As shown in FIG. 1, the illustrated first bias circuit 91 includes an NMOS first transistor M1 with a drain coupled with the first internal node 46 and a source coupled with AVEE, as well as a first bias capacitance CBN coupled between the gate of M1 and AVEE, a first bias voltage source 58 (VBN) and a switch 56 operable according to a first control signal Φe to couple the first bias voltage source 58 across the first bias capacitance CBN. The second bias circuit 92 is comprised of a second bias capacitance CBP connected between the gate and source of a second transistor M2 whose drain terminal is connected to the second internal node 48 as shown. In addition, the second bias circuit 92 includes a second bias voltage source 54 (VBP) and a switch 52 operable according to the first control signal Φe to connect the gate of M2 and the upper terminal of CBN to VBN.

In addition, the control gate terminal of M0 is selectively coupled to the output node 26 via a switch 50 operated according to the first control signal Φe to provide a negative feedback configuration of the input transistor M0 for precharging the input bias capacitance Cb to a calibration voltage as described further below. The input bias capacitance Cb in one embodiment is a single capacitor, although other embodiments are possible using multiple capacitors connected in any suitable series and/or parallel configurations to form an input bias capacitance Cb having a first terminal (on the left in FIG. 1) coupled with a third internal node 23 and a second terminal coupled with the gate of M0. In addition, the first terminal of the input bias capacitance Cb and the third internal node 23 are selectively coupleable with the constant voltage (GND) node via a switch 28 operated according to the inverse of a second control signal (Φa').

As further shown in FIG. 1, an auto-zero circuit 90 is provided including a transconductance amplifier 44 with an output coupled with the second internal node 48, as well as a non-inverting (+) input coupled with a reference voltage VREF, for example, a reference voltage used to set the input range for the A/D converter circuit 32. The transconductance amplifier 44 also has an inverting (−) input coupled with a fourth internal node 43, and an auto-zero capacitance Caz is coupled between the fourth internal node 43 and ground GND. In addition, a switch 42 is operable according to a third control signal Φb from the control circuit 36 to selectively couple the fourth internal node 43 with the output node 26 in an auto-zero interval of a first operating mode 81 as described further below. The integrator circuit input node 14 is selectively coupled with the third internal node 23 via a switch 21 and a feedback capacitance Cf is selectively coupled between the output node 26 and the third internal node 23 via switches 22 and 24 according to a second control signal Φa from the control circuit 36. The feedback capacitance Cf and the auto-zero capacitance Caz can be single capacitors or one or both of these may be formed of multiple capacitors connected in any suitable series and/or parallel configuration to form the corresponding capacitance. In addition, precharging switches 70 and 72 are operated according to a fourth control signal Φd from the control circuit 36 to selectively precharge the feedback capacitance Cf to the reference voltage VREF.

Figure 2:
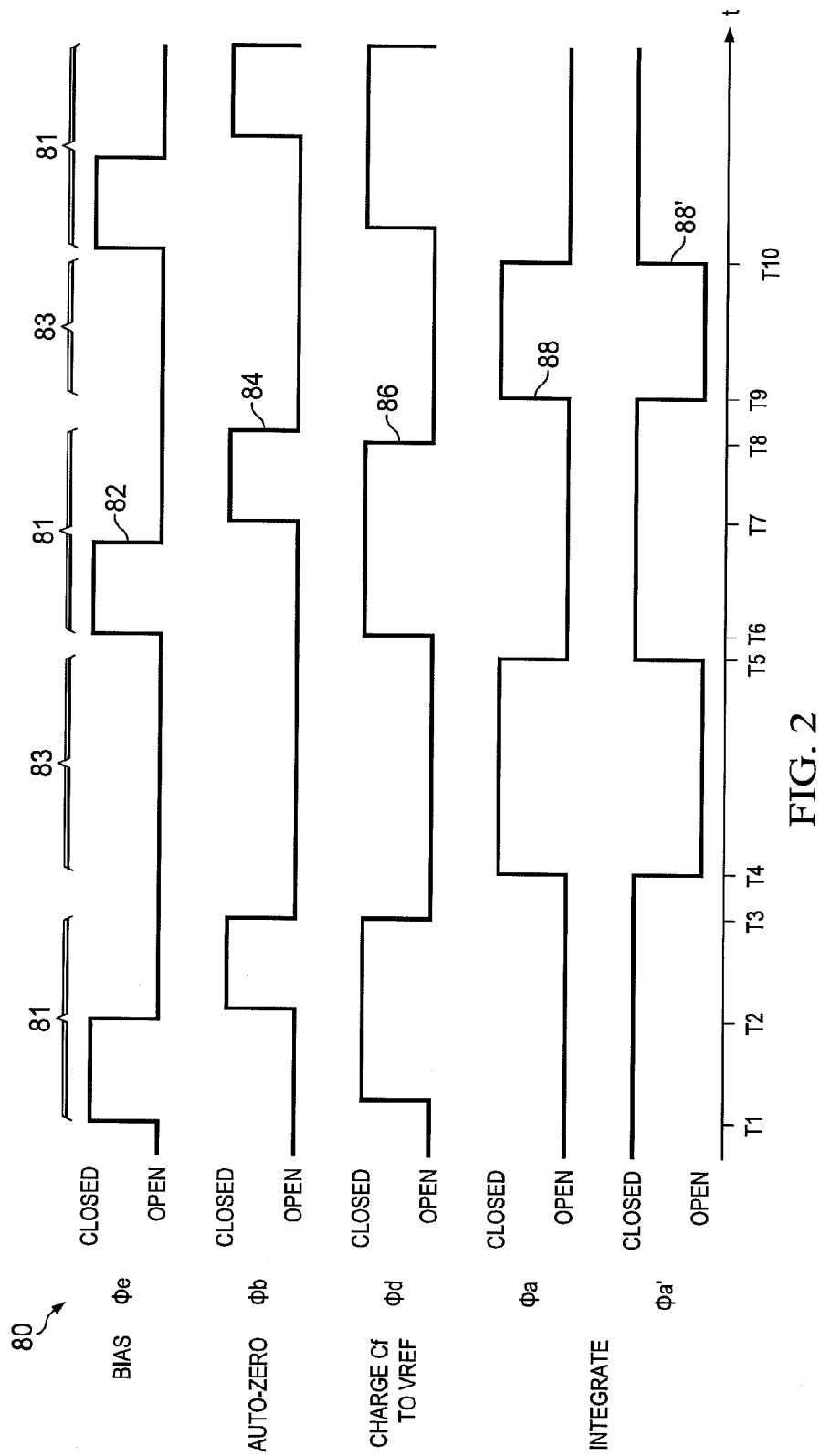
FIG. 2 is a timing diagram illustrating various waveforms during calibration and integration modes of operation in the circuit of FIG. 1.

Referring also to FIG. 2, the various switches 21, 22, 24, 28, 42, 50, 52, 56, 70 and 72 provide a switching circuit operable according to the switching control signals 38 from the control circuit 36 in a first mode 81 and a second mode 83, where the illustrated first mode 81 includes first and second time intervals for operating the integrator circuitry 20 to perform calibration and offsetting operations. FIG. 2 provides a graph 80 illustrating the control signals 38 provided by the control circuit 36 in the illustrated embodiment to implement a first mode 81, referred to herein as a calibration mode, as well as a second mode 83 (e.g., integration mode) during which the input current signal Is from the sensor 10 is received at the input node 14 and is integrated as a voltage across the feedback capacitor Cf to provide a single-ended voltage output at the output node 26 for sampling by the sample and hold circuit 30 and conversion by the A/D circuit 32. Any suitable switch circuitry can be used to implement the switches 21, 22, 24, 28, 42, 50, 52, 56, 70 and 72. For example, the individual switches may be implemented as a transfer gate including a parallel connection of a PMOS transistor and an NMOS transistor (not shown), with the control circuit providing one of the control signals 38 to the gate of one of the parallel-connected transistors and providing the inverse of that control signal to the other parallel-connected transistor. Other embodiments are possible in which different forms and configurations of transistor switches are implemented to provide the switching circuit.

The graph 80 of FIG. 2 illustrates a waveform 82 showing a bias control signal Φe (e.g., referred to herein as a first control signal) turned on (asserted high) at T1 and then brought low at T2 for operating the switches 50, 52 and 56, and a waveform 84 illustrating an "auto-zero" control signal Φb (e.g., a third control signal) which is selectively operated (e.g., asserted high at T2 and brought low at T3) to control the switch 42. The first and third control signals Φe and Φb are respectively asserted in first and second time intervals of the first mode 81 while a precharging control signal Φd (e.g., waveform 86, referred to herein as a fourth control signal) is asserted to close the precharging switches 70 and 72 to charge the feedback capacitance Cf to the reference voltage VREF. As further seen in FIG. 2, second control signal Φa (waveform 88) remains low and its inverse signal Φa' (waveform 88') is asserted (high) in the first mode 81 to close the switch 28 (e.g., thereby grounding the third internal node 23) while opening the switches 21, 22 and 24 to disconnect the third internal node 23 from the input node 14 and to disconnect the feedback capacitance Cf from the third internal node 23 and from the output node 26.

FIG. 3 illustrates the circuit 20 in the first time interval (T1-T2) of the first mode 81 in FIG. 2, with the switches 28, 50, 52 and 56 closed. In this interval of the first mode 81, the bias supplies 54 and 58 are connected across the bias capacitors CBP and CBN, respectively, with these capacitors thus being charged to the corresponding voltages (e.g., VBN=0.8 V, VBP=0.7 V) with the transistors M1 and M2 being turned on to conduct currents Im1 and Im2, with Im1 being greater than Im2. For example, the current Im2 is 20-25 µA, and the current Im1 is 100 µA in one non-limiting example. The difference between these currents is provided by the negative feedback connection of M0 which conducts a difference current Im0. The gate-source voltage required to sustain this difference current Im0 is sampled at the gate control terminal of M0, and the connection of the third internal node 23 to GND via the switch 28 causes the input bias capacitance Cb to be charged to this value, referred to herein as a calibration voltage. Thus, the calibration voltage represents the control voltage which causes M0 to conduct the current Im0 equal to the difference between Im1 flowing in M1 in the second bias current Im2 flowing in M2. In this manner, the switching circuit quantifies the required current flowing through M0 and saves that as the calibration voltage across Cb. The inventors have appreciated that the values of the currents through M1 and M2 cannot be exactly predicted and may change over time and/or temperature, and the creation of the calibration voltage across Cb during the first time interval of the first mode 81 provides an accurate calibration of the circuit 20 with respect to any noise variations on the capacitors Cb, CBP and CBN.

FIG. 4 illustrates the second interval of the first mode 81 (T2-T3 in FIG. 2), referred to as auto-zero operation to correct for noise sampled on Cb, CBP and CBN. In this interval, the bias control signal Φe is brought low at T2 to open the switches 50, 52 and 56 while the switch 28 remains closed, and the assertion of the signal Φb closes the switch 42, thereby coupling the output terminal 26 to the fourth internal node 43. In this condition, the biasing transistors M1 and M2 remain on to conduct the currents Im1 and Im2 since the corresponding bias capacitances CBN and CBP have been precharged to the corresponding supply voltages VBN and VBP. Moreover, the input bias capacitance Cb has been precharged to the calibration voltage required to conduct the corresponding difference current Im0 through M0, and this voltage is provided between the control gate terminal of M0 and the third internal node 23. In this second interval T2-T3, however, the negative feedback of M0 is disconnected, and the transconductance amplifier 44 in the auto-zero circuit 90 operates in closed loop fashion to modify the voltage at the output node 26 to a value which may be offset slightly from VREF in order to account for any noise represented on the capacitors Cb, CBP and CBN, and this offset is effectively stored as a voltage on the auto zero capacitor Caz. During subsequent integration operation during the second mode 83, this noise will be subtracted using the auto zero capacitor Caz and the transconductance amplifier 44.

FIG. 6 illustrates operation in the second mode 83 where the signals Φe, Φb and Φd are brought low while the second control signal Φa is asserted (high) at T4 to disconnect the third internal node 23 from the ground node GND. This also connects the node 23 (and hence the left side of the input bias capacitance Cb) to the input node 14 and to the left side of the feedback capacitance Cf, with the right side of Cf being connected to the output node 26 via the switch 24. In this switching circuit configuration, the voltage across the feedback capacitance Cf begins at VREF in order to provide a single-ended voltage signal at the output node 26 for sampling by the sample and hold circuit 30. In this condition, the switches 21, 22 and 24 are closed, with the switch 28 being opened, and the voltage at the third internal node 23 is controlled by the previous charging of the input bias capacitance Cb to the calibration voltage representing the gate-source voltage of M0 necessary to conduct the same current Im0 with respect to the bias currents Im1 and Im2. In this regard, the voltage at the gate of M0 will be at the previously stored calibration voltage, and thus the voltage at the other terminal of Cb (at the third internal node 23, and hence at the input node 14) is substantially zero volts. In this manner, the circuit 20 provides a zero input voltage at the input node 14 to allow proper operation of the sensor 10, while advantageously providing a single-ended output voltage at the output node 26. In this regard, the operation in the second mode 83 advantageously provides a voltage at the output node 26 (e.g., at the right terminal of Cf in the figures) which begins at the value of VREF and decreases according to the amount of input current Is received from the sensor 10, with the auto-zeroing transconductance amplifier 44 offsetting the output voltage by any offset related to noise in the circuit 20 as previously determined by the charging of Caz.

The second mode completes at T5 in FIG. 2, with the control signal Φa being brought low, and the graph 80 in FIG. 2 shows several cycles of this process including first mode operation 81 (T6, T7, T8) and second mode operation 83 (T9, T10). This process may be repeated periodically in certain implementations, with integration operation (second mode 83) in a series of cycles with intervening calibration operations (first mode 81). In another possible implementation, the circuit 20 undergoes an initial calibration operation in the first mode 81, followed by a fairly continuous integration operation in the second mode 83, where a host system (e.g., control system 36) may initiate another calibration operation in the first mode 81 at any suitable time, for example, to accommodate temperature effects, drift effects, etc. in the circuit 20. In one possible example, integration operation in the second mode 83 is implemented for approximately 100 µs, and calibration operation in the first mode 81 is implemented for approximately 2 µs between each integration cycle. In another possible application, two circuits 20 are provided for integration operation with respect to a single input channel connection at node 14, with one of the circuits 20 operating in continuous integration mode 83 while the other circuit 20 is calibrated in the first mode 81, and the circuit connections can be swapped at any time to ensure fresh calibration of the circuit 20 currently in use.

The inventors have appreciated that the single ended amplifier architecture in the circuit 20 advantageously facilitates reduction of consumed power, for example, by approximately 50% relative to conventional differential amplifier implementations since roughly half the number of transistors are required to implement the integrator amplifier, and no subsequent differential to single-ended amplifier stage is needed. In addition, the circuit 20 also accommodates reduced noise in the integration and auto zero phases, for example, by around 3 dB in certain implementations. For a host data acquisition system, for a lowest front-end gain case, system noise may be reduced in certain implementations by 3.3 dB for a 6 dB reduction in front-end noise, wherein noise reduction will be higher (e.g., about 5 dB-5.5 dB) for the entire system.

The above examples are merely illustrative of several possible embodiments of various aspects of the present disclosure, wherein equivalent alterations and/or modifications will occur to others skilled in the art upon reading and understanding this specification and the annexed drawings. In addition, although a particular feature of the disclosure may have been disclosed with respect to only one of multiple implementations, such feature may be combined with one or more other features of other embodiments as may be desired and advantageous for any given or particular application. Also, to the extent that the terms "including", "includes", "having", "has", "with", or variants thereof are used in the detailed description and/or in the claims, such terms are intended to be inclusive in a manner similar to the term "comprising".

What is claimed is:

1. A current to voltage integrator circuit, comprising:
an input node for selectively receiving a current input signal from an associated sensor;
an input transistor having a control terminal and a second terminal for providing a current to a first internal node at least partially according to a voltage at the control terminal;
a first bias circuit comprising a first transistor coupled between the first internal node and a first supply node;
a second bias circuit comprising a second transistor coupled between a second supply node and a second internal node;
an amplifier circuit comprising a third transistor coupled between an output node and the first internal node, and a fourth transistor coupled between the second internal node and the output node;
a feedback capacitance selectively coupled between the output node and a third internal node;
an input bias capacitance including a first terminal coupled with the third internal node and a second terminal coupled with the control terminal of the input transistor; and
a switching circuit configured to operate in a first mode to couple the control terminal of the input transistor with the output node while coupling the third internal node to a constant voltage node to charge the input bias capacitance to a calibration voltage representing a control voltage which causes the input transistor to conduct a current equal to a difference between a first bias current flowing in the first transistor and a second bias current flowing in the second transistor, the switching circuit configured to operate in a second mode to disconnect the third internal node from the constant voltage node and couple the third internal node with the input node and a first terminal of the feedback capacitance to cause the calibration voltage across the input bias capacitance to maintain an input bias voltage at the input node, and to couple a second terminal of the feedback capacitance with the output node to control a single-ended output voltage at the output node at least partially according to the current input signal.

2. The current to voltage integrator circuit of claim 1, wherein the switching circuit comprises:
a first switch coupled between the control terminal of the input transistor and the output node, the first switch configured to operate according to a first control signal in the first mode to connect the control terminal of the input transistor to the output terminal, and in the second mode to disconnect the control terminal of the input transistor from the output terminal;
a second switch coupled between the third internal node and the constant voltage node, the second switch configured to operate according to a second control signal in the first mode to connect the third internal node to the constant voltage node, and in the second mode to disconnect the third internal node from the constant voltage node; and
a third switch coupled between the input node and the third internal node, the third switch configured to operate according to the second control signal in the first mode to disconnect the input node from the third internal node, and in the second mode to connect the input node to the third internal node.

3. The current to voltage integrator circuit of claim 2, comprising:
a transconductance amplifier with a first input coupled with a reference voltage, a second input coupled with a fourth internal node, and an output coupled with the second internal node;
an offset capacitance coupled between the fourth internal node and the constant voltage node; and
a fourth switch coupled between the output node and the fourth internal node, the fourth switch configured to operate according to a third control signal in the first mode to connect the output node to the fourth internal node to charge the offset capacitance, and in the second mode to disconnect the output node from the fourth internal node.

4. The current to voltage integrator circuit of claim 3:
wherein the first transistor is an NMOS transistor comprising a gate terminal, a source terminal coupled with a first supply node, and a drain terminal coupled with the first internal node;
wherein the first bias circuit comprises: a first bias capacitance coupled between the gate terminal of the first transistor and the first supply node, a first bias voltage source, and a fifth switch coupled between the gate terminal of the first transistor and the first bias voltage source, the fifth switch configured to operate according to the first control signal in the first mode to connect the gate terminal of the first transistor to the first bias voltage source, and in the second mode to disconnect the gate terminal of the first transistor from the first bias voltage source;
wherein the second transistor is a PMOS transistor comprising a gate terminal, a source terminal coupled with a second supply node at a higher voltage than a voltage of the first supply node, and a drain terminal coupled with the second internal node; and
wherein the second bias circuit comprises: a second bias capacitance coupled between the gate terminal of the second transistor and the second supply node, a second bias voltage source, and a sixth switch coupled between the gate terminal of the second transistor and the second bias voltage source, the sixth switch configured to operate according to the first control signal in the first mode to connect the gate terminal of the second transistor to the second bias voltage source, and in the second mode to disconnect the gate terminal of the second transistor from the second bias voltage source.

5. The current to voltage integrator circuit of claim 4:
wherein the first mode includes a first time interval and a second time interval;
wherein the current to voltage integrator circuit comprises a control circuit providing the first, second and third control signals;
wherein the control circuit is configured to operate in the first time interval of the first mode to:
provide the first control signal in a first state to cause the first switch to connect the control terminal of the input transistor to the output terminal to charge the input bias capacitance to the calibration voltage, to cause the fifth switch to connect the gate terminal of the first transistor to the first bias voltage source to charge the first bias capacitance to a voltage of the first bias voltage source, and to cause the sixth switch to connect the gate terminal of the second transistor to the second bias voltage source to charge the second bias capacitance to a voltage of the second bias voltage source; provide the second control signal in a second state to cause the third switch to disconnect the input node from the third internal node, and to cause the second switch to connect the third internal node to the constant voltage node; and provide the third control signal in a second state to cause the fourth switch to disconnect the output node from the fourth internal node; and wherein the control circuit is configured to operate in the second time interval of the first mode to:

provide the first control signal in a second state to cause the first switch to disconnect the control terminal of the input transistor from the output terminal, to cause the fifth switch to disconnect the gate terminal of the first transistor from the first bias voltage source, and to cause the sixth switch to disconnect the gate terminal of the second transistor from the second bias voltage source; provide the second control signal in the second state to cause the third switch to disconnect the input node from the third internal node, and to cause the second switch to connect the third internal node to the constant voltage node; and provide the third control signal in a first state to cause the fourth switch to connect the output node to the fourth internal node to charge the offset capacitance to a voltage of the output node.

6. The current to voltage integrator circuit of claim 5, wherein the control circuit is Configured to operate in the second mode to: provide the first control signal in the second state to cause the first switch to disconnect the control terminal of the input transistor from the output terminal, to cause the fifth switch to disconnect the gate terminal of the first transistor from the first bias voltage source, and to cause the sixth switch to disconnect the gate terminal of the second transistor from the second bias voltage source; provide the second control signal in a first state to cause the third switch to connect the input node to the third internal node to allow the current input signal to set a voltage across the feedback capacitance, and to cause the second switch to disconnect the third internal node from the constant voltage node to cause the calibration voltage across the input bias capacitance to maintain the input bias voltage at the input node; and provide the third control signal in the second state to cause the fourth switch to disconnect the output node from the fourth internal node.

7. The current to voltage integrator circuit of claim 4, wherein the switching circuit Is configured to operate in the first mode to disconnect the feedback capacitance from the output node and from the third internal node and to connect the feedback capacitance between the reference voltage and the constant voltage node, and wherein the switching circuit is configured to operate in the second mode to disconnect the feedback capacitance from the reference voltage and from the constant voltage node and to connect the feedback capacitance between the output node and the third internal node.

8. The current to voltage integrator circuit of claim 3:
wherein the first mode includes a first time interval and a second time interval;
wherein the current to voltage integrator circuit comprises a control circuit providing the first, second and third control signals;
wherein the control circuit is configured to operate in the first time interval of the first mode to: provide the first control signal in a first state to cause the first switch to connect the control terminal of the input transistor to the output terminal to charge the input bias capacitance to the calibration voltage; provide the second control signal in a second state to cause the third switch to disconnect the input node from the third internal node, and to cause the second switch to connect the third internal node to the constant voltage node; and provide the third control signal in a second state to cause the fourth switch to disconnect the output node from the fourth internal node; and wherein the control circuit is configured to operate in the second time interval of the first mode to: provide the first control signal in a second state to cause the first switch to disconnect the control terminal of the input transistor from the output terminal; provide the second control signal in the second state to cause the third switch to disconnect the input node from the third internal node, and to cause the second switch to connect the third internal node to the constant voltage node; and provide the third control signal in a first state to cause the fourth switch to connect the output node to the fourth internal node to charge the offset capacitance to a voltage of the output node.

9. The current to voltage integrator circuit of claim 2, wherein the switching circuit is configured to operate in the first mode to disconnect the feedback capacitance from the output node and from the third internal node and to connect the feedback capacitance between the reference voltage and the constant voltage node, and wherein the switching circuit is configured to operate in the second mode to disconnect the feedback capacitance from the reference voltage and from the constant voltage node and to connect the feedback capacitance between the output node and the third internal node.

10. The current to voltage integrator circuit of claim 1, wherein the input transistor is a PMOS transistor comprising a gate terminal connected to the second terminal of the input bias capacitance, a source terminal connected to the constant voltage node, and a drain terminal connected to the first internal node.

11. The current to voltage integrator circuit of claim 10, wherein the input bias capacitance maintains a substantially zero voltage at the input node in the second mode.

12. The current to voltage integrator circuit of claim 10, wherein the switching circuit comprises:
a first switch coupled between the control terminal of the input transistor and the output node, the first switch configured to operate according to a first control signal in the first mode to connect the control terminal of the input transistor to the output terminal, and in the second mode to disconnect the control terminal of the input transistor from the output terminal;
a second switch coupled between the third internal node and the constant voltage node, the second switch configured to operate according to a second control signal in the first mode to connect the third internal node to the constant voltage node, and in the second mode to disconnect the third internal node from the constant voltage node; and
a third switch coupled between the input node and the third internal node, the third switch Configured to operate according to the second control signal in the first mode to disconnect the input node from the third internal node, and in the second mode to connect the input node to the third internal node.

13. The current to voltage integrator circuit of claim 12, comprising:
a transconductance amplifier with a first input coupled with a reference voltage, a second input coupled with a fourth internal node, and an output coupled with the second internal node;

an offset capacitance coupled between the fourth internal node and the constant voltage node; and a fourth switch coupled between the output node and the fourth internal node, the fourth switch configured to operate according to a third control signal in the first mode to connect the output node to the fourth internal node to charge the offset capacitance, and in the second mode to disconnect the output node from the fourth internal node.

14. The current to voltage integrator circuit of claim 13:

wherein the first transistor is an NMOS transistor comprising a gate terminal, a source terminal coupled with a first supply node, and a drain terminal coupled with the first internal node;

wherein the first bias circuit comprises: a first bias capacitance coupled between the gate terminal of the first transistor and the first supply node, a first bias voltage source, and a fifth switch coupled between the gate terminal of the first transistor and the first bias voltage source, the fifth switch configured to operate according to the first control signal in the first mode to connect the gate terminal of the first transistor to the first bias voltage source, and in the second mode to disconnect the gate terminal of the first transistor from the first bias voltage source;

wherein the second transistor is a PMOS transistor comprising a gate terminal, a source terminal coupled with a second supply node at a higher voltage than a voltage of the first supply node, and a drain terminal coupled with the second internal node; and wherein the second bias circuit comprises: a second bias capacitance coupled between the gate terminal of the second transistor and the second supply node, a second bias voltage source, and a sixth switch coupled between the gate terminal of the second transistor and the second bias voltage source, the sixth switch configured to operate according to the first control signal in the first mode to connect the gate terminal of the first transistor to the second bias voltage source, and in the second mode to disconnect the gate terminal of the second transistor from the second bias voltage source.

15. The current to voltage integrator circuit of claim 13:

wherein the first mode includes a first time interval and a second time interval;

wherein the current to voltage integrator circuit comprises a control circuit providing the first, second and third control signals;

wherein the control circuit is configured to operate in the first time interval of the first mode to: provide the first control signal in a first state to cause the first switch to connect the control terminal of the input transistor to the output terminal to charge the input bias capacitance to the calibration voltage; provide the second control signal in a second state to cause the third switch to disconnect the input node from the third internal node, and to cause the second switch to connect the third internal node to the constant voltage node; and provide the third control signal in a second state to cause the fourth switch to disconnect the output node from the fourth internal node; and wherein the control circuit is configured to operate in the second time interval of the first mode to: provide the first control signal in a second state to cause the first switch to disconnect the control terminal of the input transistor from the output terminal; provide the second control signal in the second state to cause the third switch to disconnect the input node from the third internal node, and to cause the second switch to connect the third internal node to the constant voltage node; and provide the third control signal in a first state to cause the fourth switch to connect the output node to the fourth internal node to charge the offset capacitance to a voltage of the output node.

16. The current to voltage integrator circuit of claim 12, wherein the switching circuit is configured to operate in the first mode to disconnect the feedback capacitance from the output node and from the third internal node and to connect the feedback capacitance between the reference voltage and the constant voltage node, and wherein the switching circuit is configured to operate in the second mode to disconnect the feedback capacitance from the reference voltage and from the constant voltage node and to connect the feedback capacitance between the output node and the third internal node.

17. The current to voltage integrator circuit of claim 1, wherein the switching circuit is operable in the first mode to disconnect the feedback capacitance from the output node and from the third internal node and to connect the feedback capacitance between a reference voltage and the constant voltage node, and wherein the switching circuit is configured to operate in the second mode to disconnect the feedback capacitance from the reference voltage and from the constant voltage node and to connect the feedback capacitance between the output node and the third internal node.

18. The current to voltage integrator circuit of claim 1, wherein the input bias capacitance maintains a substantially zero voltage at the input node in the second mode.

19. An integrator circuit, comprising:

an input node for selectively receiving a current input signal from an associated sensor;

an input transistor having a control terminal and a second terminal for providing a current to a first internal node at least partially according to a voltage at the control terminal;

a first bias circuit comprising a first transistor coupled between the first internal node and a first supply node;

a second bias circuit comprising a second transistor coupled between a second supply node and a second internal node;

an amplifier circuit comprising a third transistor coupled between an output node and the first internal node, and a fourth transistor coupled between the second internal node and the output node;

a feedback capacitance selectively coupled between the output node and a third internal node;

an input bias capacitance including a first terminal coupled with the third internal node and a second terminal coupled with the control terminal of the input transistor; and a switching circuit configured to operate in a first mode to couple the control terminal of the input transistor with the output node while coupling the third internal node to a constant voltage node to charge the input bias capacitance to a calibration voltage, the switching circuit configured to operate in a second mode to disconnect the third internal node from the constant voltage node and couple the third internal node with the input node and a first terminal of the feedback capacitance to maintain an input bias voltage of zero volts at the input node, and to couple a second terminal of the feedback capacitance to provide a single-ended output voltage at the output node.

20. An integrator circuit, comprising:
- an input transistor having a control terminal and a second terminal for providing a current to a first internal node at least partially according to a voltage at the control terminal;
- a feedback capacitance selectively coupled between an input node and an output node;
- an input bias capacitance including a first terminal selectively coupled with one of the input node and a constant voltage node, and a second terminal coupled with the control terminal of the input transistor; and
- a switching circuit configured to operate in a first mode to provide negative feedback from the output node to the control terminal of the input transistor while coupling the first terminal of the input bias capacitance with the constant voltage node, and in a second mode to couple the first terminal of the input bias capacitance with the input node and a first terminal of the feedback capacitance to maintain an input bias voltage of zero volts at the input node, and to couple a second terminal of the feedback capacitance to provide a single-ended output voltage at the output node based at least partially on a current input signal received at the input node.

* * * * *